United States Patent
Chen et al.

(10) Patent No.: US 10,270,020 B2
(45) Date of Patent: Apr. 23, 2019

(54) LED PACKAGE STRUCTURE

(71) Applicant: Lextar Electronics Corporation, Hsinchu (TW)

(72) Inventors: Dao-Wei Chen, New Taipei (TW); Kun-Jung Wu, Hsinchu (TW); Bo-Yu Ko, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/628,627

(22) Filed: Jun. 20, 2017

(65) Prior Publication Data

US 2018/0366626 A1  Dec. 20, 2018

(51) Int. Cl.
| | |
|---|---|
| *H01L 23/043* | (2006.01) |
| *H01L 33/62* | (2010.01) |
| *H01L 33/52* | (2010.01) |
| *H01L 33/22* | (2010.01) |
| *H01L 21/48* | (2006.01) |
| *H01L 23/31* | (2006.01) |

(52) U.S. Cl.
CPC .......... *H01L 33/62* (2013.01); *H01L 21/4875* (2013.01); *H01L 23/043* (2013.01); *H01L 23/3157* (2013.01); *H01L 33/22* (2013.01); *H01L 33/52* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2013/0107169 A1* | 5/2013 | Yoo | .................. H01L 33/58 349/62 |
| 2016/0276549 A1 | 9/2016 | Yamashita et al. | |
| 2016/0315230 A1 | 10/2016 | Yoshimura et al. | |
| 2017/0153382 A1 | 6/2017 | Wang et al. | |

FOREIGN PATENT DOCUMENTS

TW    I525848 B    3/2016

* cited by examiner

*Primary Examiner* — Cheung Lee
(74) *Attorney, Agent, or Firm* — CKC & Partners Co., LLC

(57) ABSTRACT

An LED package structure includes a first metal plate, a second metal plate, and a mold. The first metal plate has at least one first protrusion portion. The second metal plate has at least one second protrusion portion. The mold is disposed on the first metal plate and the second metal plate, in which the mold has a first side surface, a second side surface opposite to the first side surface, a third side surface, and a fourth side surface opposite to the third side surface. The first and second protrusion portion protrude respectively from the first side surface and the second side surface, and the first metal plate and the second metal plate are covered by the third side surface and the fourth side surface, in which a portion of the first side surface between the first edge and the first protrusion portion is a fracture surface.

10 Claims, 24 Drawing Sheets

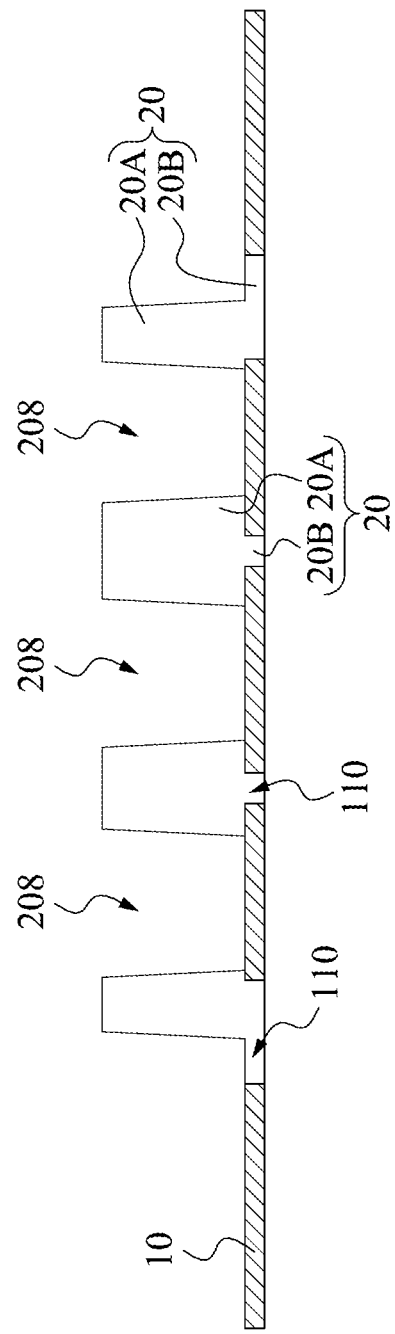

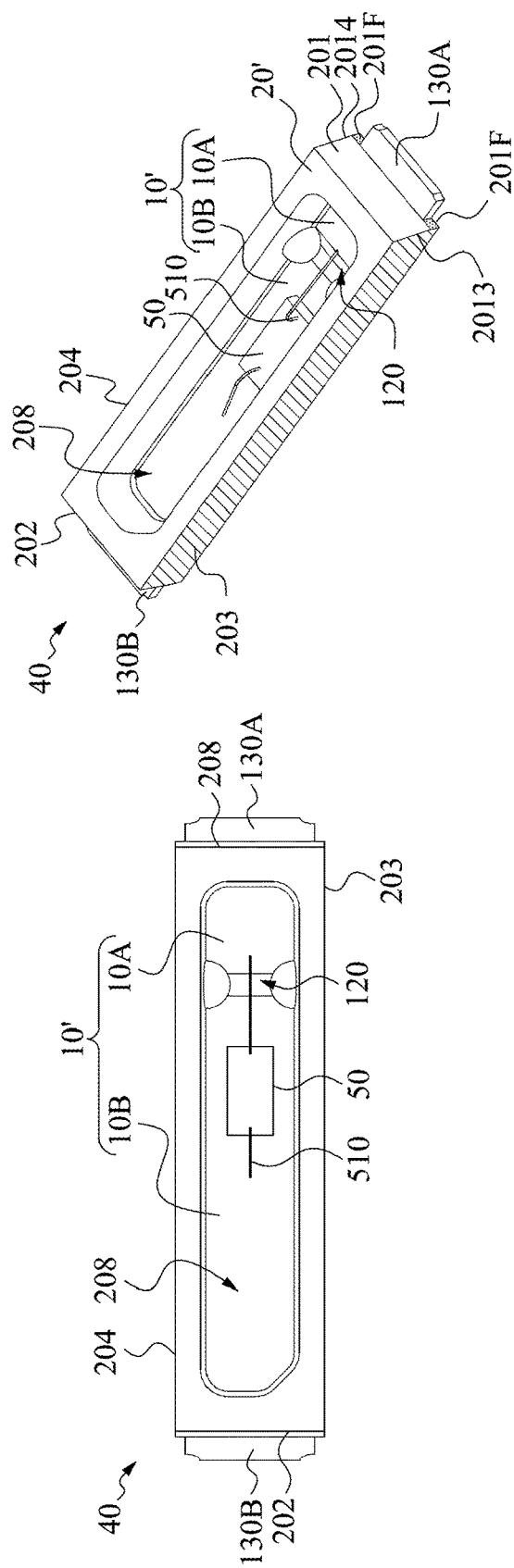

LED PACKAGE STRUCTURE

BACKGROUND

Technical Field

The disclosure relates to a light emitting diode packaging structure, and more particularly to a light emitting diode packaging structure prepared by punching and cutting process.

Description of Related Art

Recently, light-emitting diodes (LEDs) have been widely used in general lighting and commercial lighting fields. While serving as a light source, LEDs have several advantages, such as lower power consumption, longer life-time, smaller size, and high-speed switching operation. Thus, LEDs have gradually replaced the conventional incandescent light, and are utilized in different products. In LED manufacturing process, molding material is disposed on a lead frame having LED dies thereon. Then, the lead frame and the molding material thereon are divided to form several LED packages. In this regard, the process for making the LED packages may affect the reliability and yield of the products.

SUMMARY

The present disclosure provides an LED package structure includes a first metal plate, a second metal plate, and a mold. The first metal plate has at least one first protrusion portion. The second metal plate has at least one second protrusion portion. The mold is disposed on the first metal plate and the second metal plate, in which the mold has a first side surface, a second side surface opposite to the first side surface, a third side surface, and a fourth side surface opposite to the third side surface. The first and second protrusion portion protrude respectively from the first side surface and the second side surface, and the first metal plate and the second metal plate are covered by the third side surface and the fourth side surface, in which a portion of the first side surface between the first edge and the first protrusion portion is a fracture surface.

The present disclosure provides an LED package structure prepared by a process comprising the steps of providing a package structure, in which the package structure includes a lead frame and a base mold disposed on the lead frame, and a portion of the lead frame protrudes from a first side surface of the base mold; punching the portion of the lead frame to form a plurality of protrusion portions protruding from the first side surface of the base mold; and cutting the package structure along a direction substantially vertical to the first side surface to form a plurality of the LED package structures, in which the cutting is performed without cutting the lead frame.

The present disclosure provides an LED package structure including a lead frame and at least one base bold. The lead frame includes a plurality of first holes and a plurality of second holes, in which one of the second holes intersects with parts of the first holes. The base mold is disposed on the lead frame, in which the base mold includes an first portion exposed from the lead frame and a second portion engaged in the first holes of the lead frame, and each of the first holes crosses the base mold along a first direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-7B illustrate a method of manufacturing an LED package at various stages in accordance with some embodiments.

DETAILED DESCRIPTION

Figure 1A:
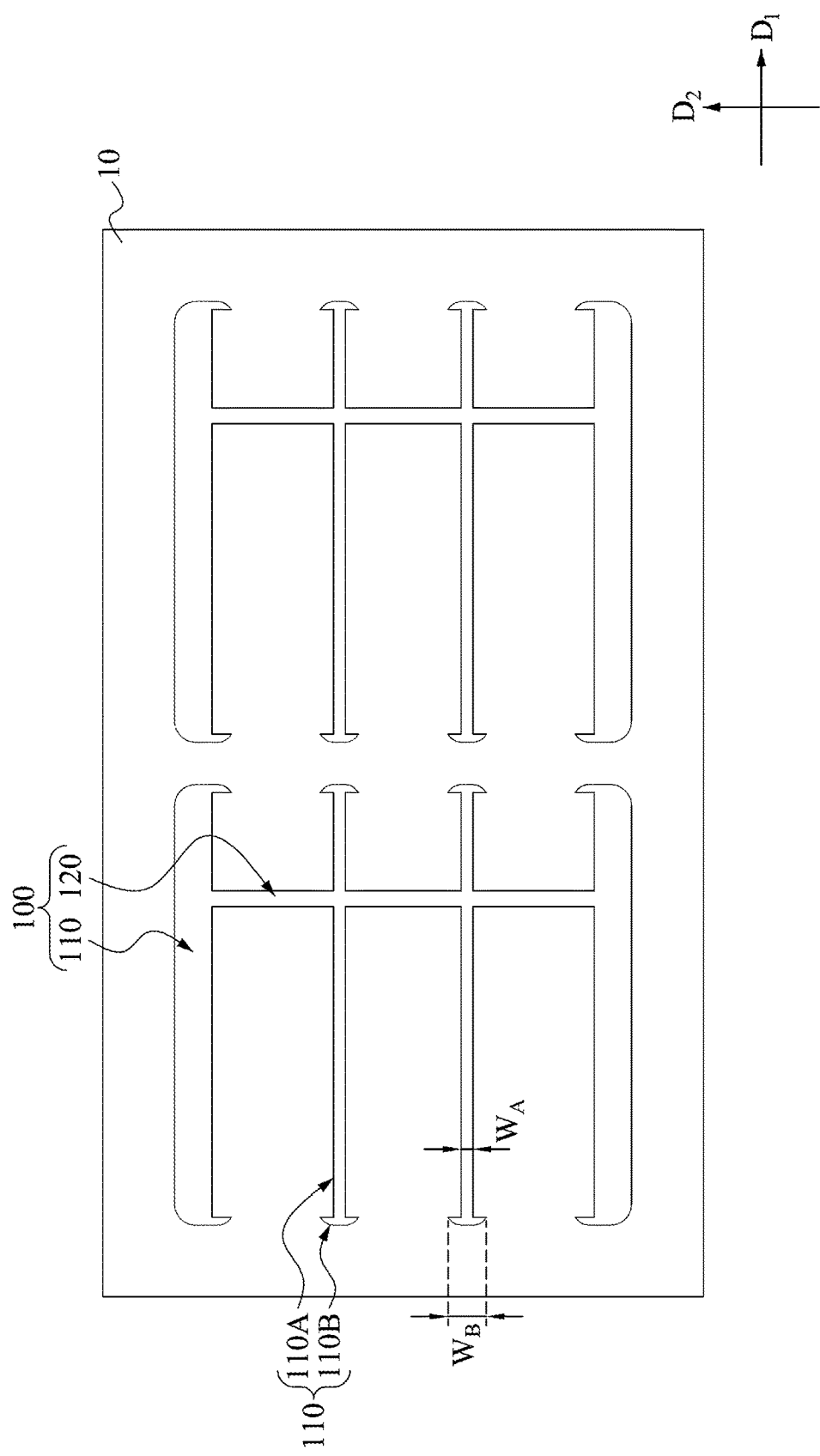

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-7B illustrate a method of manufacturing an LED package at various stages in accordance with some embodiments.

Figure 1B:
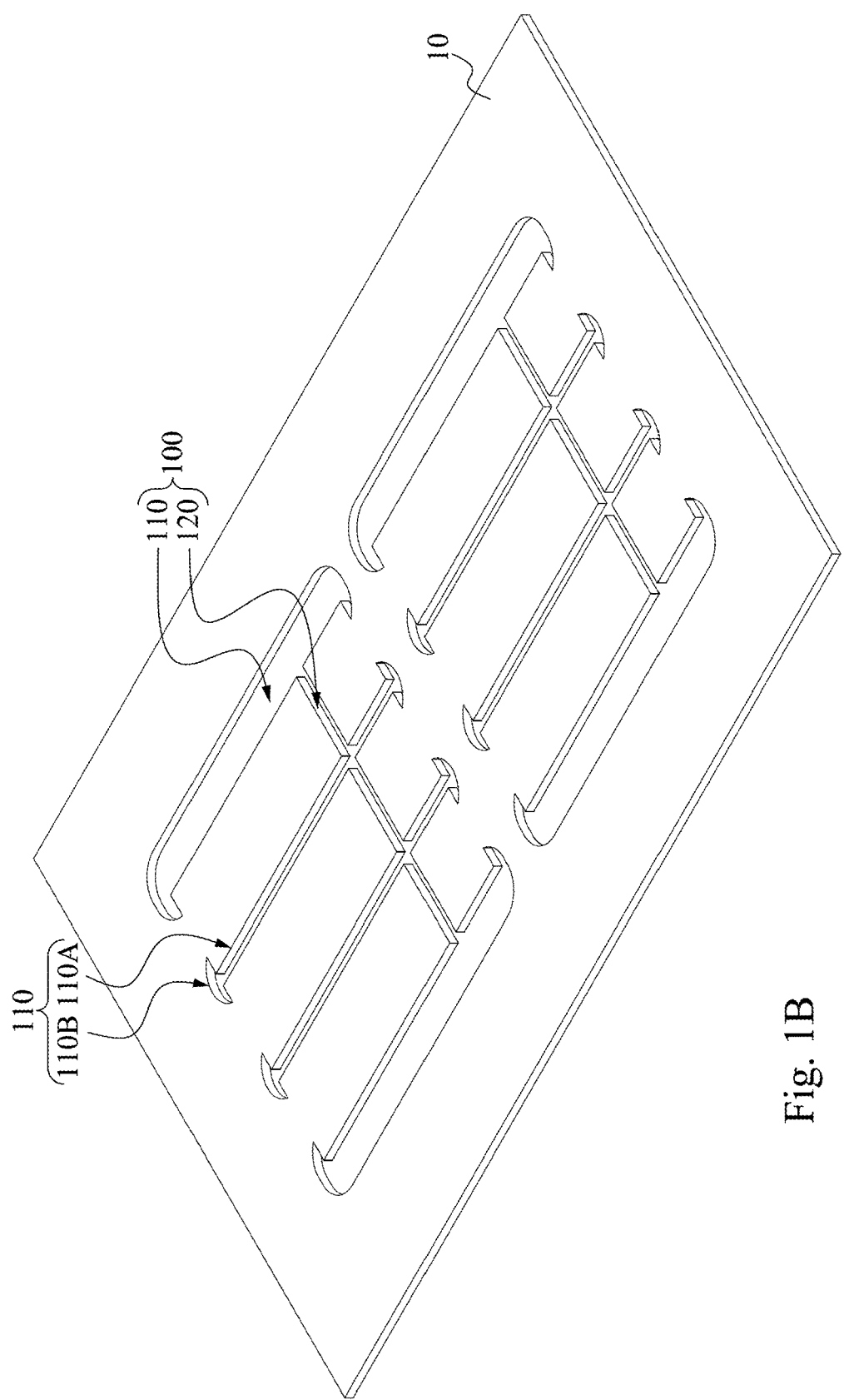

Reference is made to FIGS. 1A and 1B. A lead frame 10 is provided. The lead frame 10 includes a plurality of first holes 110 and second holes 120. In the present embodiment, the first holes 110 substantially extend along a first direction D1, and the second holes 120 substantially extend along a second direction D2, which is vertical to the first direction D1. In other words, the first holes 110 are substantially orthogonal to the second holes 120, but the present disclosure does not limit thereto. Also, the numbers of the first holes 110 and the second holes 120 are merely used to explain, but the present disclosure does not limit thereto. In some embodiments, the first holes 110 and the second holes 120 may be formed by patterning the lead frame 10 with a predetermined pattern. In some embodiments, the lead frame 10 made be made of metal or alloy such as indium tin oxide (ITO), copper (Cu), nickel (Ni), silver (Ag), aluminum (Al), tin (Sn), gold (Au), or combinations thereof.

In some embodiments, one of the second holes 120 intersects with parts of the first holes 110. For example, in FIGS. 1A and 1B, each of the second holes 120 intersects with four first holes 110, and the combination thereof may be referred to as a hole set 100. The holes sets 100 are arranged in matrix. In practice, the number of the holes sets 100 may be more than 10.

Each of the first holes 110 includes a main portion 110A and two wider portions 110B, in which the wider portions 110B are present at opposite sides of the main portion 110A of the first holes 110. In some embodiments, the width $W_B$ of the wider portion 110B is greater than the width $W_A$ of the main portion 110A along the second direction D2.

Figure 2A:
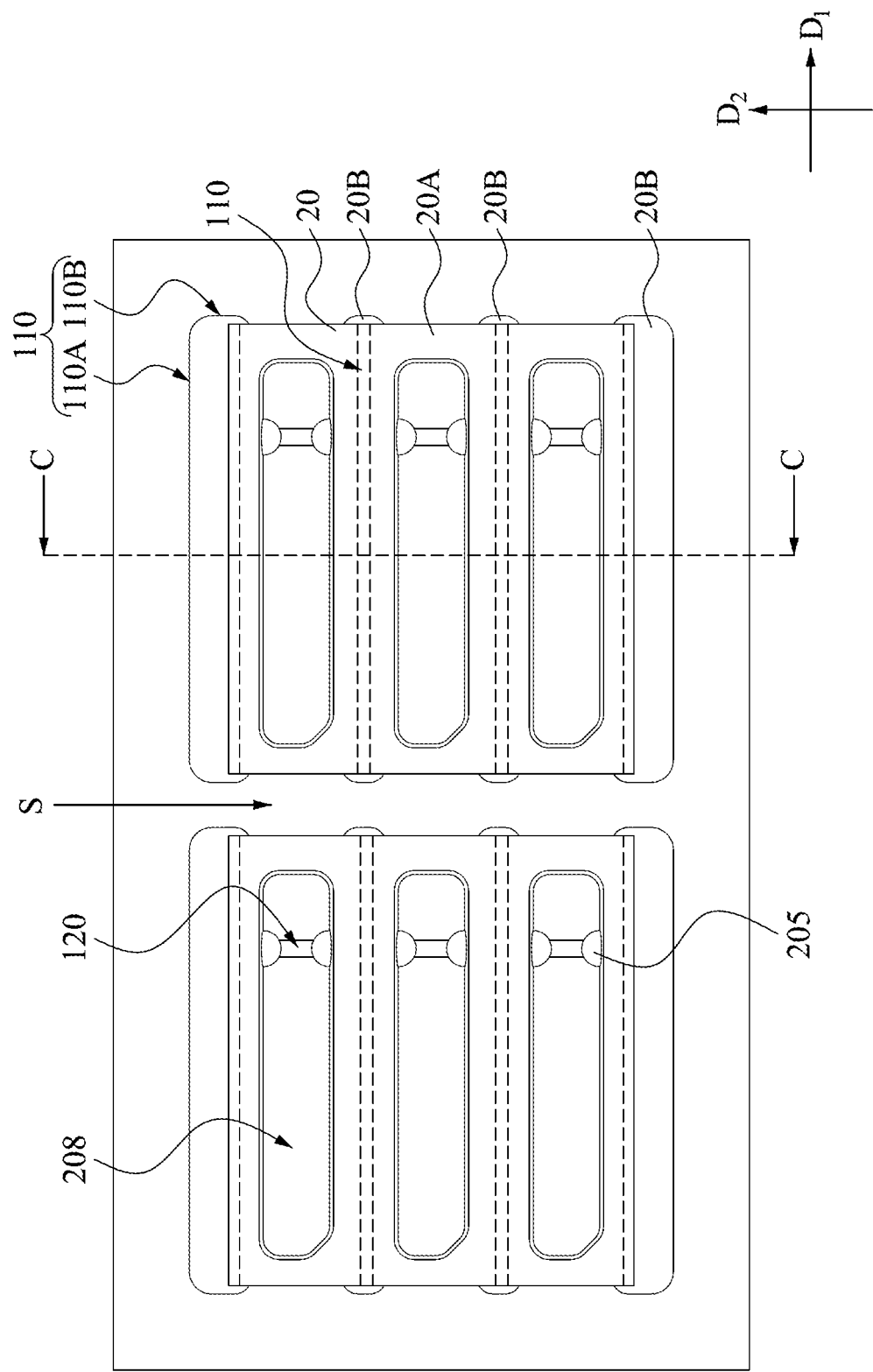
Figure 2B:
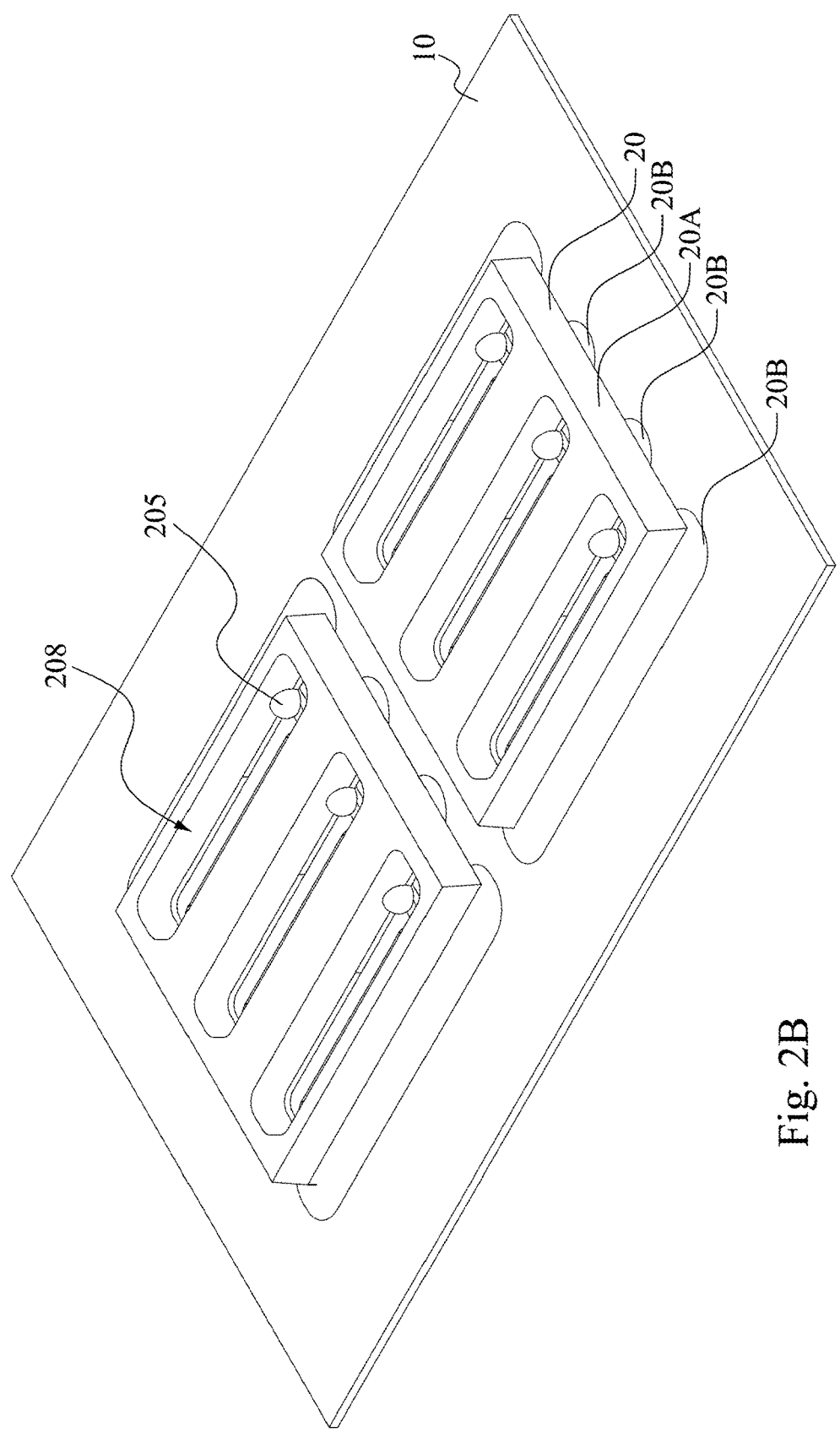

Reference is made to FIGS. 2A, 2B, and 2C. FIG. 2C is a cross-sectional view cut along line C-C of FIG. 2A. An injection molding process is performed on the lead frame 10 using a molding material, such as a thermosetting resin. As a result, plural base molds 20 are molded over the lead frame 10 in a spaced apart manner. The base molds 20 are arranged along the first direction D1 and cover parts of the hole sets 100 (referring to FIGS. 1A and 1B). In some embodiments, each of the base molds 20 includes several openings 208 expose parts of the second holes 120 of the lead frame 10. In some embodiments, each of the base molds 20 includes at least one spherical structure 205 partially engaged in the second holes 120.

As shown in FIG. 2C, parts of the base molds 20 are molded into the first holes 110. From other perspectives, each of the base mold 20 includes a first portion 20A and a second portion 20B connected to each other, in which the first portion 20A is exposed from the lead frame 10, and the second portion 20B is engaged in the first holes 110 of the lead frame 10.

Referring back to FIGS. 2A and 2B, the second portion 20B engaged in the wider portion 110B of the first holes 110 is partially exposed from the first portion 20A of the base mold 20. State differently, the wider portion 110B of the first holes 110 extend outside the first portion 20A of the base molds 20, and the wider portion 110B of the first holes 110 is filled with the base molds 20.

In FIG. 2A, the first holes 110 (shown in dash-line) of the lead frame 10 substantially cross the base mold 20 along the first direction D1. Thus, during the cutting process performed in later step (e.g. FIGS. 5A and 5B), the cutting line may be positioned along the first holes 110. Detail description will be discussed later.

Accordingly, since the first holes 110 of the lead frame 10 are substantially filled with the second portion 20B of the base mold 20, a portion of the lead frame 10 continuously lies in a space S between two adjacent base molds 20, and without other holes present therein (except the first holes 110 filled with the base molds 20). That is, the portion of the lead frame 10 between two adjacent base molds has no hollow spaces present therein. Thus, the structural strength is improved.

Figure 3:
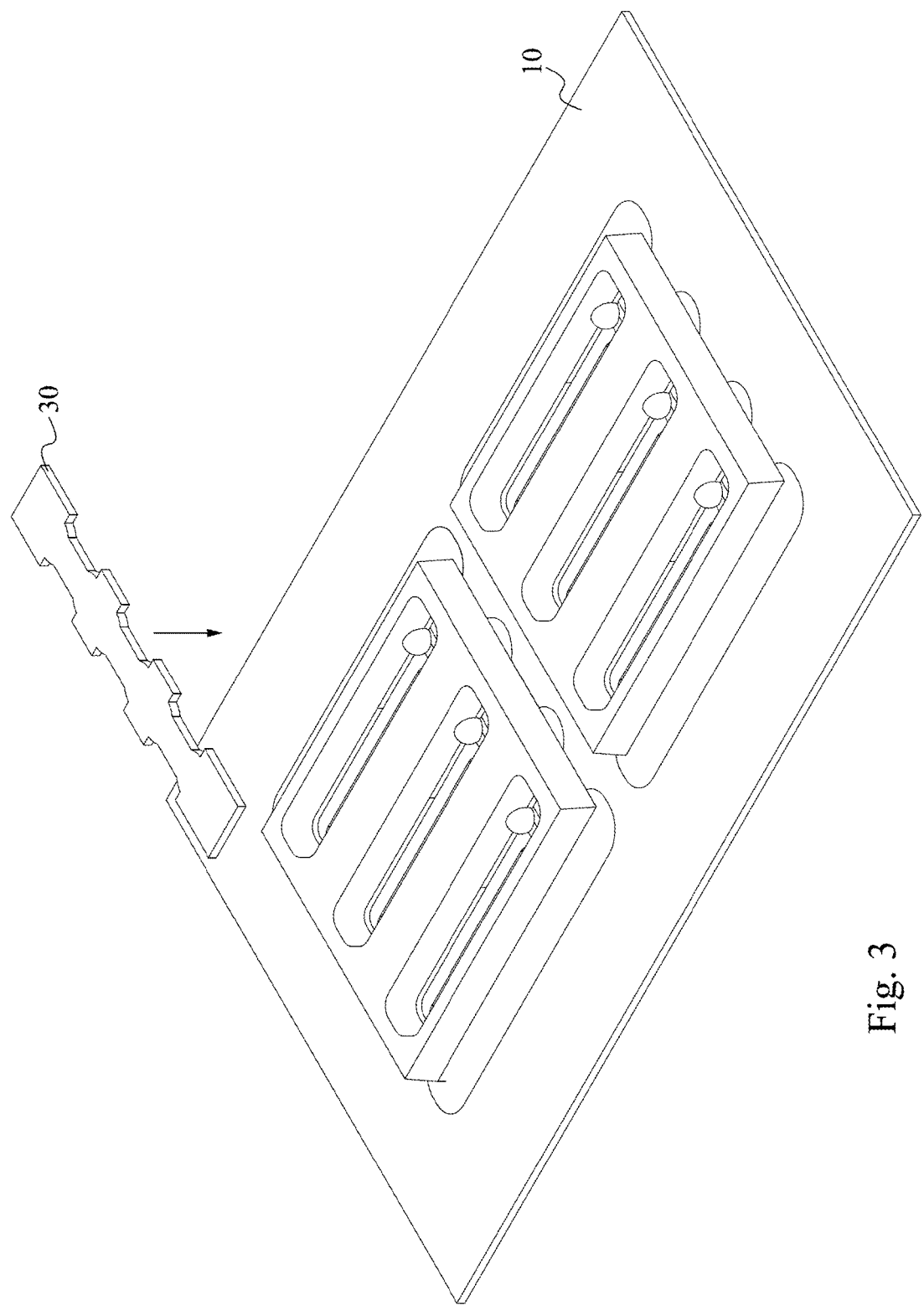

Reference is made to FIG. 3. A punching process is performed to the lead frame 10 and the base molds 20. In some embodiments, the punching process is performed by moving a punch tool 30 with a predetermined pattern downwardly to remove parts of the lead frame 10.

Figure 4A:
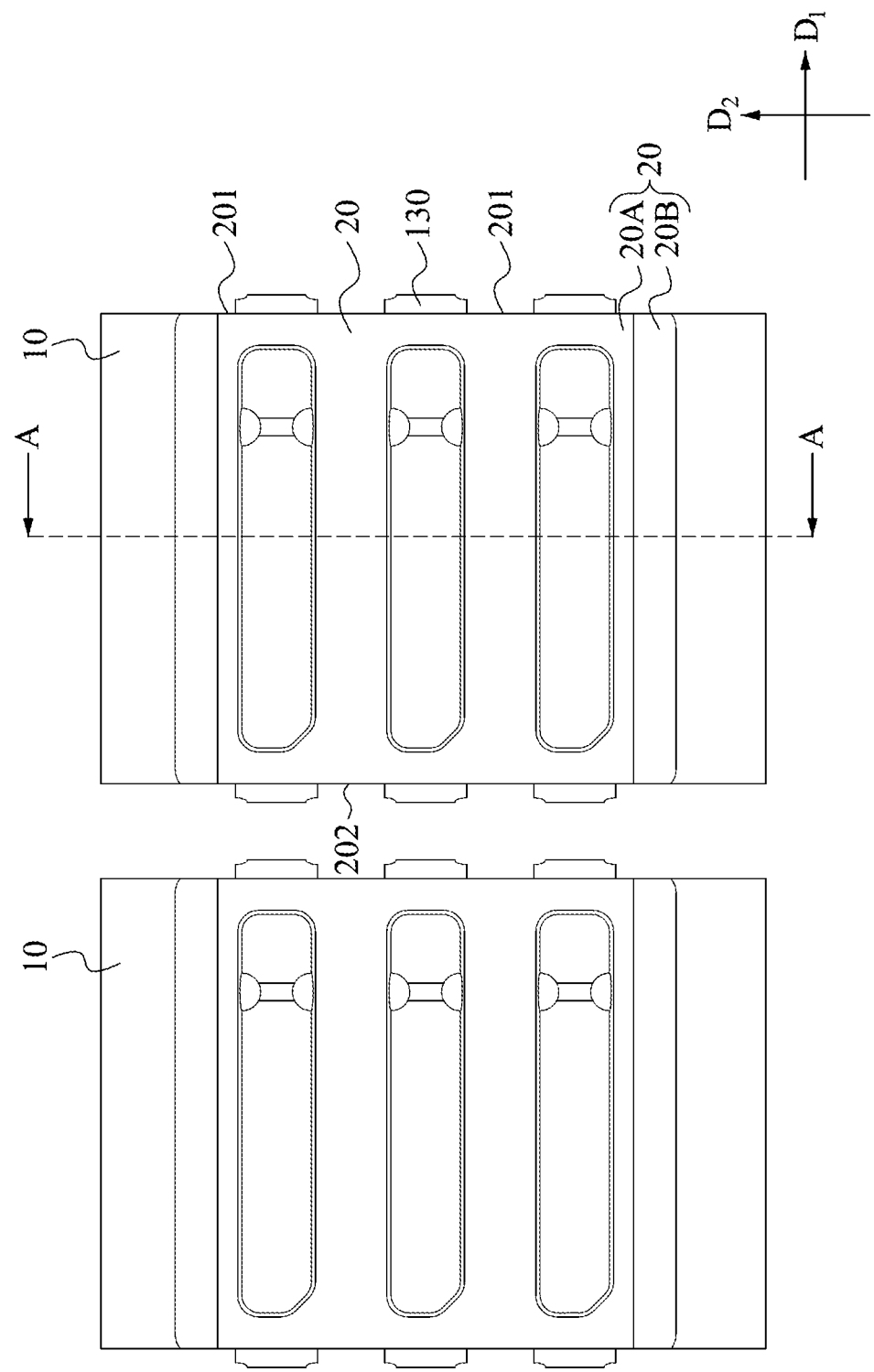
Figure 4B:
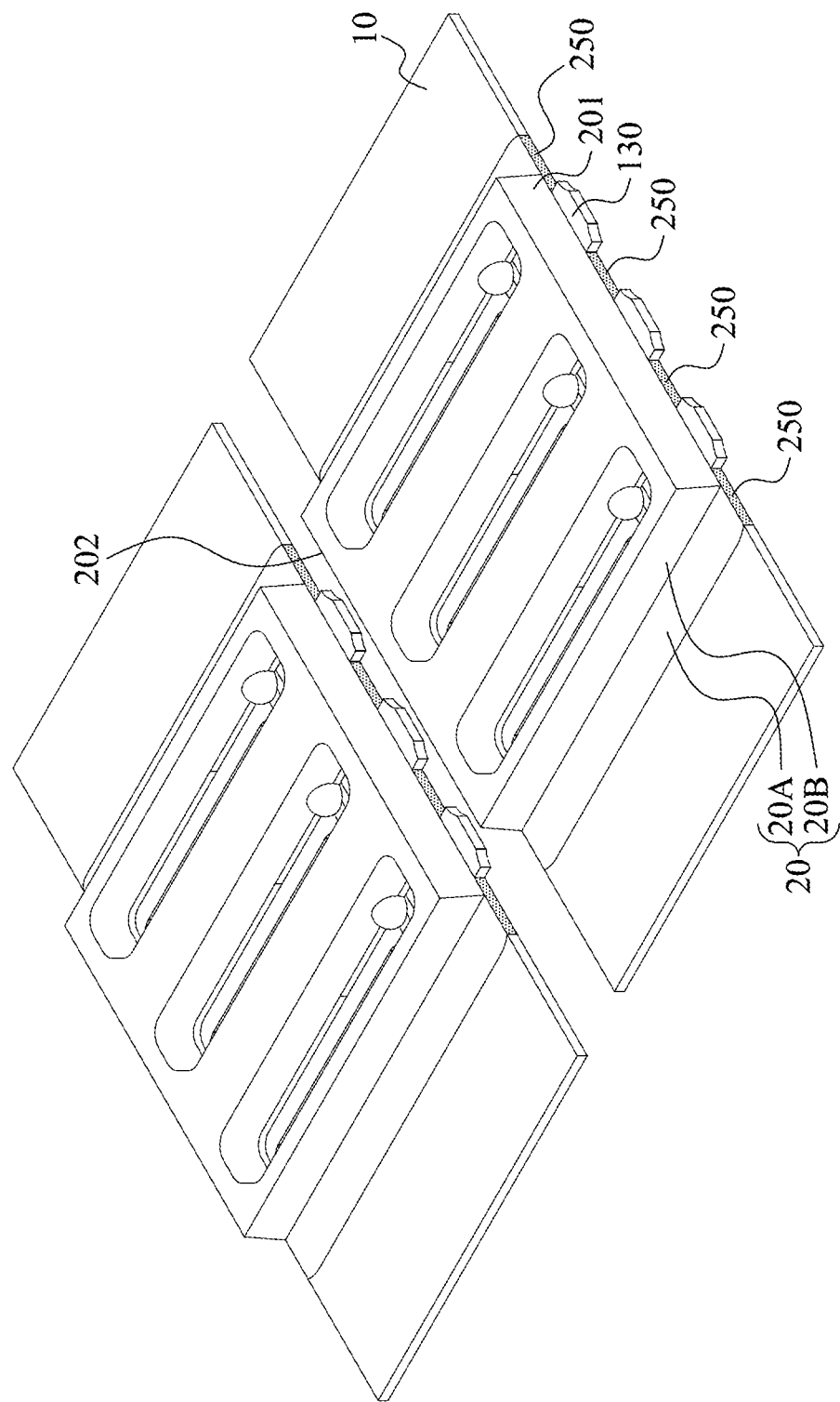

Reference is made to FIGS. 4A and 4B. After the punching process, the lead frame 10 is divided into several pieces. Each of the divided lead frames 10 corresponds with a base mold 20, respectively. The divided lead frame 10 includes a plurality of protrusion portions 130 extending along the first direction. From other perspectives, the punching process is performed to portions of the lead frame 10 protruding from the side surfaces 201 and 202 along the first direction D1 of the base mold 20 to form the protrusion portions 130. The shape of the protrusion portion 130 is defined by the shape of the punch tool 30 in FIG. 3. In practice, person skilled in this art may design the shape of the punch tool to obtain a desired shape of the protrusion portion 130.

Referring back to FIGS. 2A, 2B, and 2C, since a portion of the lead frame 10 continuously lies in a space S between two adjacent base molds 20, the structure may have stronger structural strength during the punching process. Accordingly, the structure may prevent from damage and have better yield.

During the punching process, parts of the second portion 20B of the base molds 20 engaged in the wider portion 110B of the first holes 110 (referring to FIGS. 2A and 2B) are removed. As a result, in FIG. 4B, the remained portion of the base mold 20 has a plurality of fracture surfaces 250, in which the fracture surfaces 250 are originated from removing parts of the base molds 20 engaged in the wider portion 110B of the first holes 110 during the punch process.

Figure 5A:
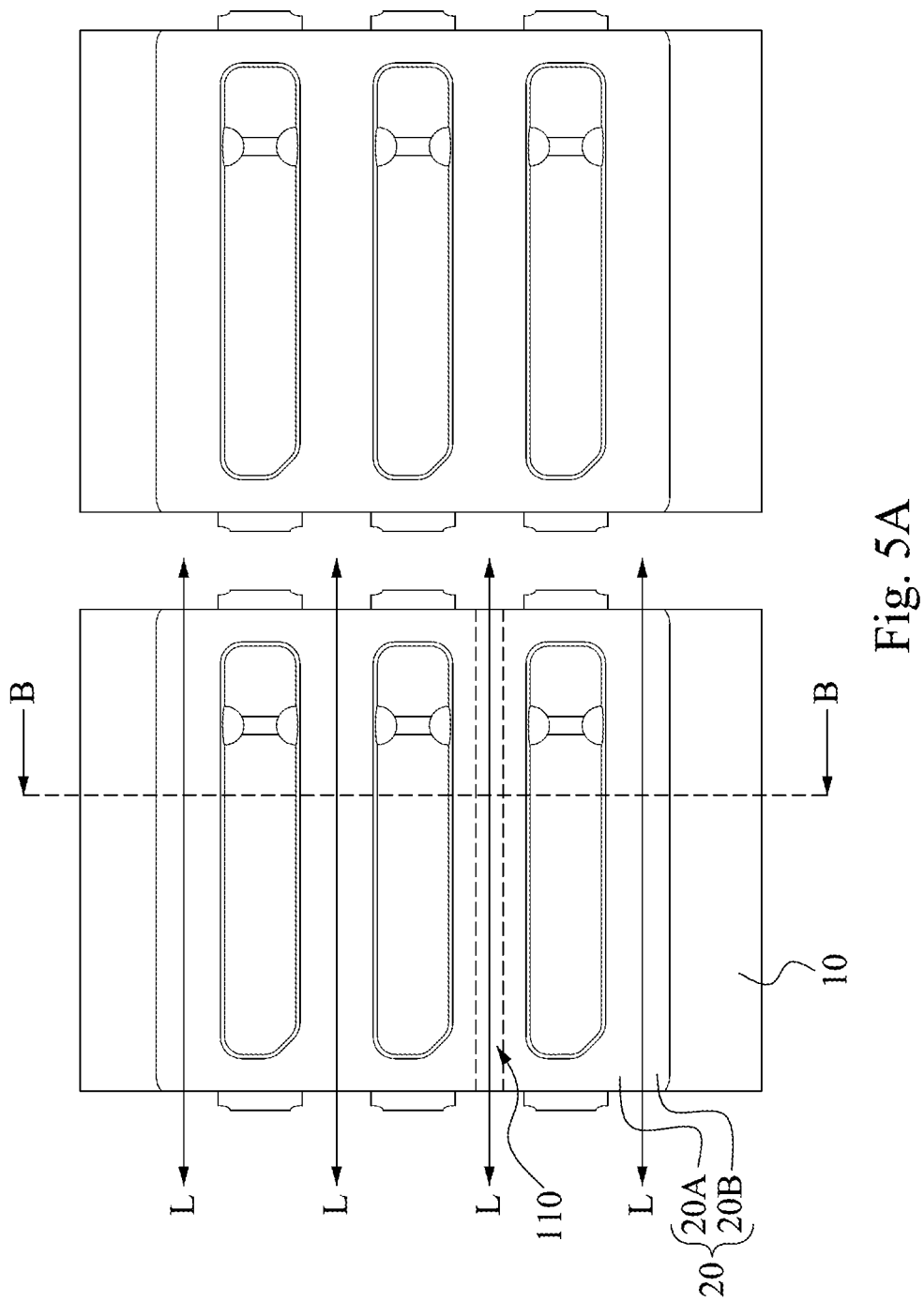
Figure 5B:
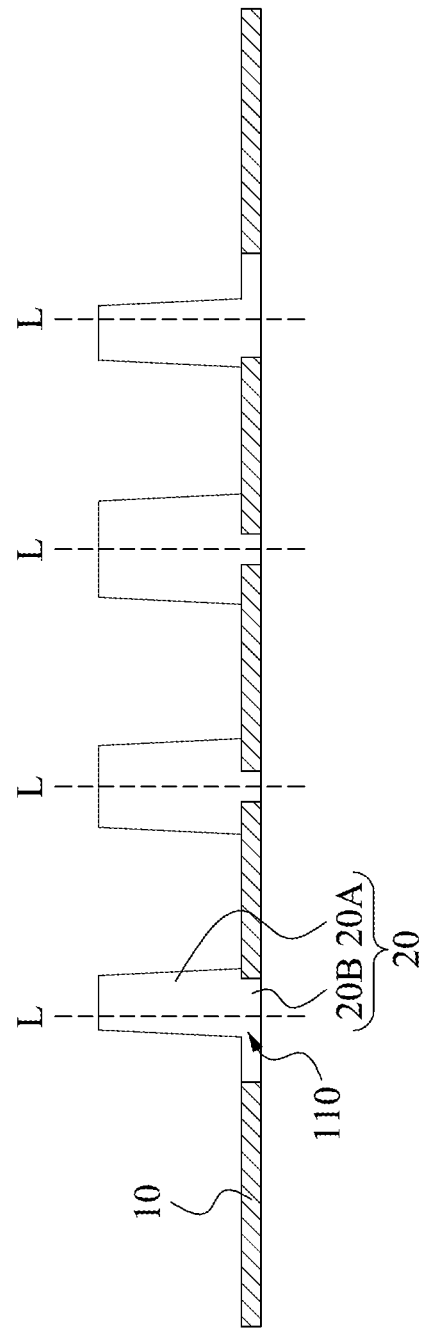

Reference is made to FIGS. 5A and 5B. FIG. 5B is a cross-sectional view cut from line B-B of FIG. 5A. A cutting process is performed to the base molds 20. During the cutting process, the cutting line L is positioned along the first holes 110 crossing the base mold 20. In other words, the cutting line L is predetermined to bypass the lead frame 10, and thus the cutting tool (such as blade) may not cut through the metal material of the lead frame. In some embodiments, the cutting line is substantially vertical to the side surface 201 of the base mold 20, as shown in FIG. 5A. Referring to FIG. 5B, the cutting line is vertically extended through the first holes 110 of the lead frame 10, in that the first holes 110 are filled with the second portion 20B of the base mold 20. As a result, the cutting process may be performed without cutting the lead frame, and the cost of tool wear can be reduced.

In some embodiments, the cutting process may be performed by, for example, using a circular blade rotated in high speed to cut the base molds 20. In comparison, the punching process described in FIG. 3 is performed by, for example, moving a punch tool downwardly to remove parts of the lead frame 10 and parts of the base molds 20. The punching process described in FIG. 3 is applied to shape the protrusion portion 130 of the lead frame 10, and the cutting process is applied to divide the structure into individual package. In some embodiments, the punching process defines properties of two opposite side surfaces of a package (e.g. side surfaces 201 and 202 in FIG. 7B), and the cutting process defines properties of another two opposite side surfaces (e.g. side surfaces 203 and 204 in FIG. 7B) of a package. Detail description will be discussed later.

Figure 6A:
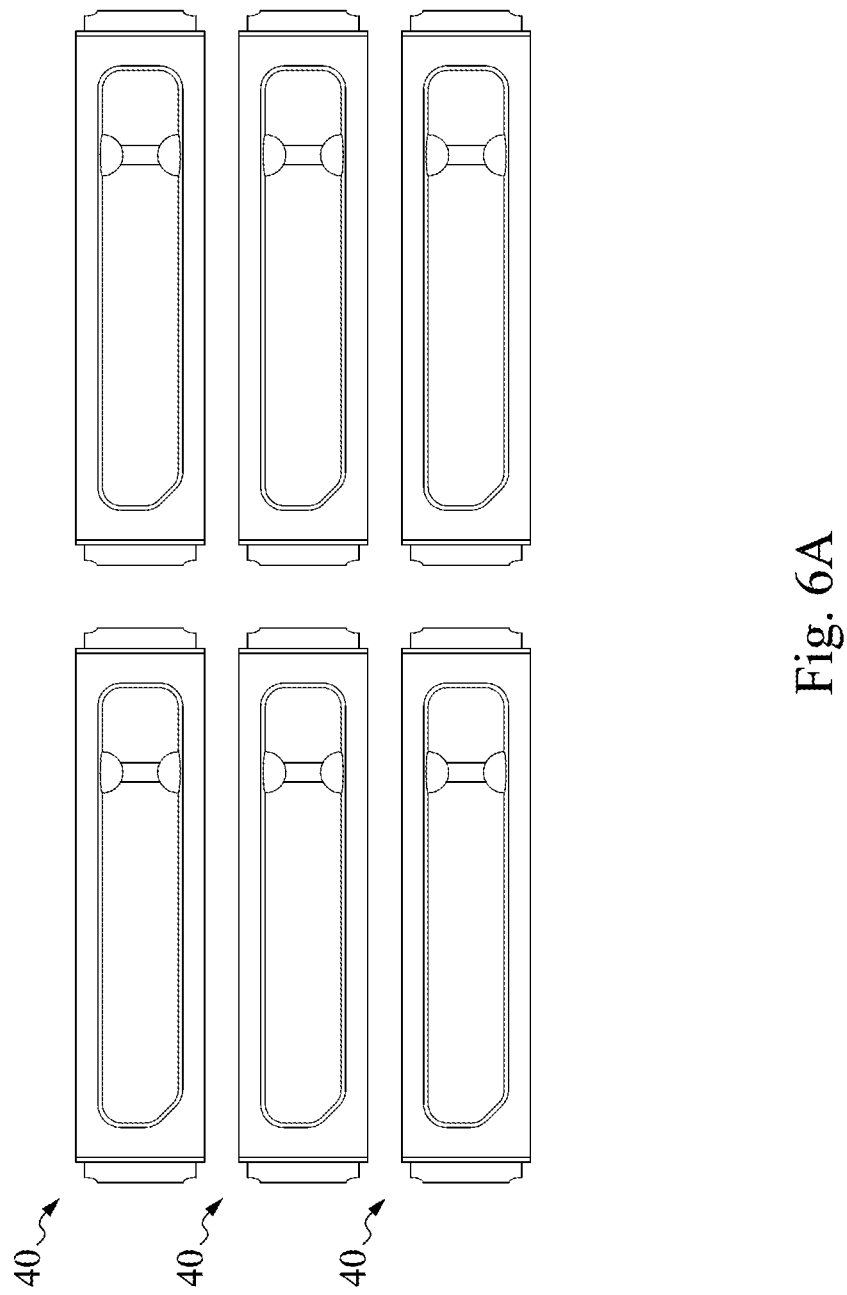
Figure 6B:
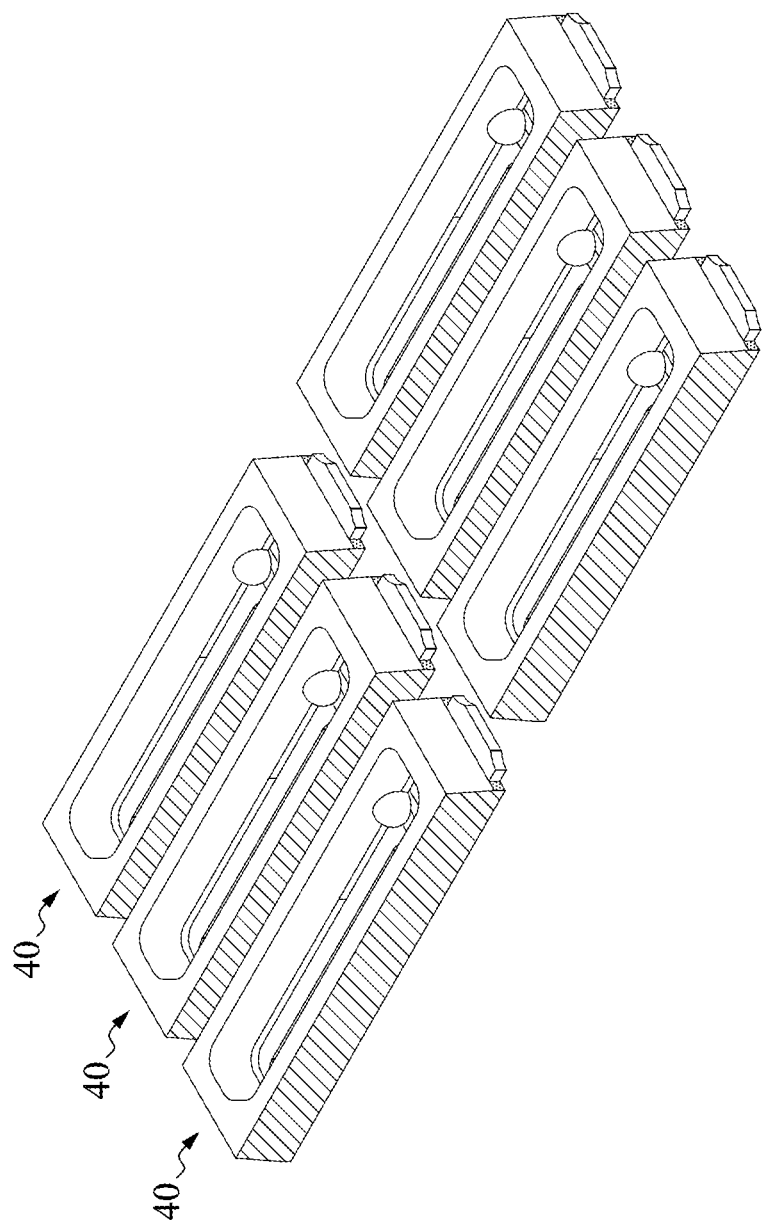

Reference is made to FIGS. 6A and 6B. After the cutting process, several LED packages 40 are formed.

Reference is made to FIGS. 7A and 7B. The LED package 40 includes a first metal plate 10A and a second metal plate 10B separated by the second hole 120. The first metal plate 10A and a second metal plate 10B may collectively be referred to as a conductive plate 10', in which the conductive plate 10' is originated from the lead frame 10 described in FIGS. 1A to 5B. The LED package 40 further includes a mold 20' disposed over the conductive plate 10', in which the mold 20' is originated from the base mold 20 described in FIGS. 1A to 5B.

The first metal plate 10A has a first protrusion portion 130A, and the second metal plate 10B has a second protrusion portion 130B. The mold 20' has side surfaces 201, 202, 203, and 204, in which the side surface 201 is opposite to the side surface 202, and the side surface 203 is opposite to the side surface 204. The side surfaces 203 and 204 are defined by the cutting process described in FIGS. 5A and 5B. The first protrusion portion 130A of the first metal plate 10A and the second protrusion portion 130B of the second metal plate 10B protrude respectively from the side surface 201 and 202. The side surfaces 203 and 204 cover the first metal plate 10A and the second metal plate 10B, respectively. That is, the first metal plate 10A and the second metal plate 10B protrude from the side surfaces 201 and 202 of the mold 20', and are covered by the side surfaces 203 and 204 of the of the mold 20'.

The side surface 201 intersects with the side surface 203 and 204 at edges 2013 and 2014, respectively. The side surface 201 has fracture portions 201F, in which one of the fracture portions 201F is present between the protrusion portion 130A and the edge 2013, and another one of the fracture portions 201F is present between the protrusion portion 130A and the edge 2014. In other words, the protrusion portion 130A is spaced from the edges 2013 and 2014 by the fracture portions 201F of the side surface 201. The fracture portions 201F are connected to the side surfaces 203 and 204, respectively. It is noted that the fracture portions 201F are defined by the punching process described in FIG. 3. Similar feature also presents on the side surface 202, and will not repeat herein.

On the other hands, the side surfaces 203 and 204 are cutting plane defined by the cutting process described in FIGS. 5A and 5B. Due to the different properties between the cutting and punching processes, the cutting plane of side surfaces 203 and 204 have finer texture than the fracture portions 201F of the side surface 201. In other words, the fracture portions 201F of the side surface 201 are rougher than the side surfaces 203 and 204. As described in FIGS. 5A and 5B, since the cutting process is performed to bypass the lead frame 10, the side surfaces 203 and 204 are free of metal. In other words, the material of the side surfaces 203 and 204 is non-metal.

The LED package 40 includes a light emitting diode 50 having at least two wires 510 disposed on the second metal plate 10B and in the opening 208 of the mold 20'. The wires 510 of the light emitting diode 50 are electrically connected to the first metal plate 10A and the second metal plate 10B, respectively. In some embodiments, the light emitting diode 50 may be bonded to the first metal plate 10A and the second metal plate 10B by flip chip bonding.

Figure 8:
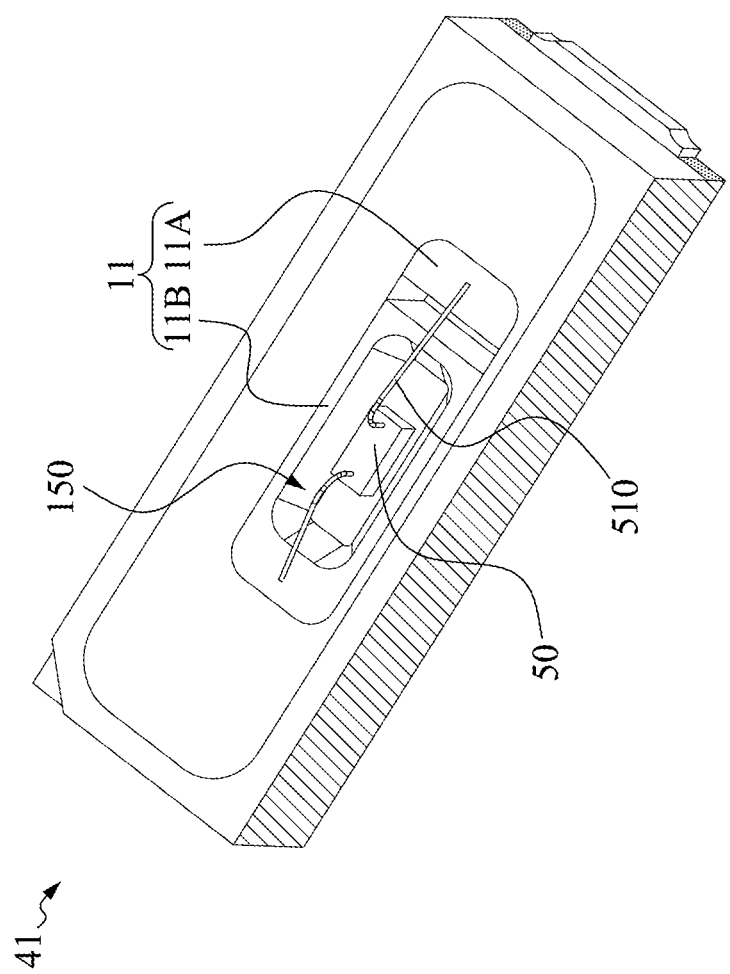
FIGS. 8-10 illustrate LED packages in accordance with some embodiments.

FIG. 8 is a perspective view of an LED package in accordance with some embodiments of the present disclosure. An LED package 41 includes a conductive plate 11, in which the conductive plate 11 has a first metal plate 11A and a second metal plate 11B. In this embodiment, the second metal plate 11B has a recess 150 therein. A light emitting diode 50 is disposed in the recess 150 of the second metal plate 11B, and the wires 510 of the light emitting diode 50 are electrically connected to the first metal plate 11A and the second metal plate 11B, respectively.

Figure 9:
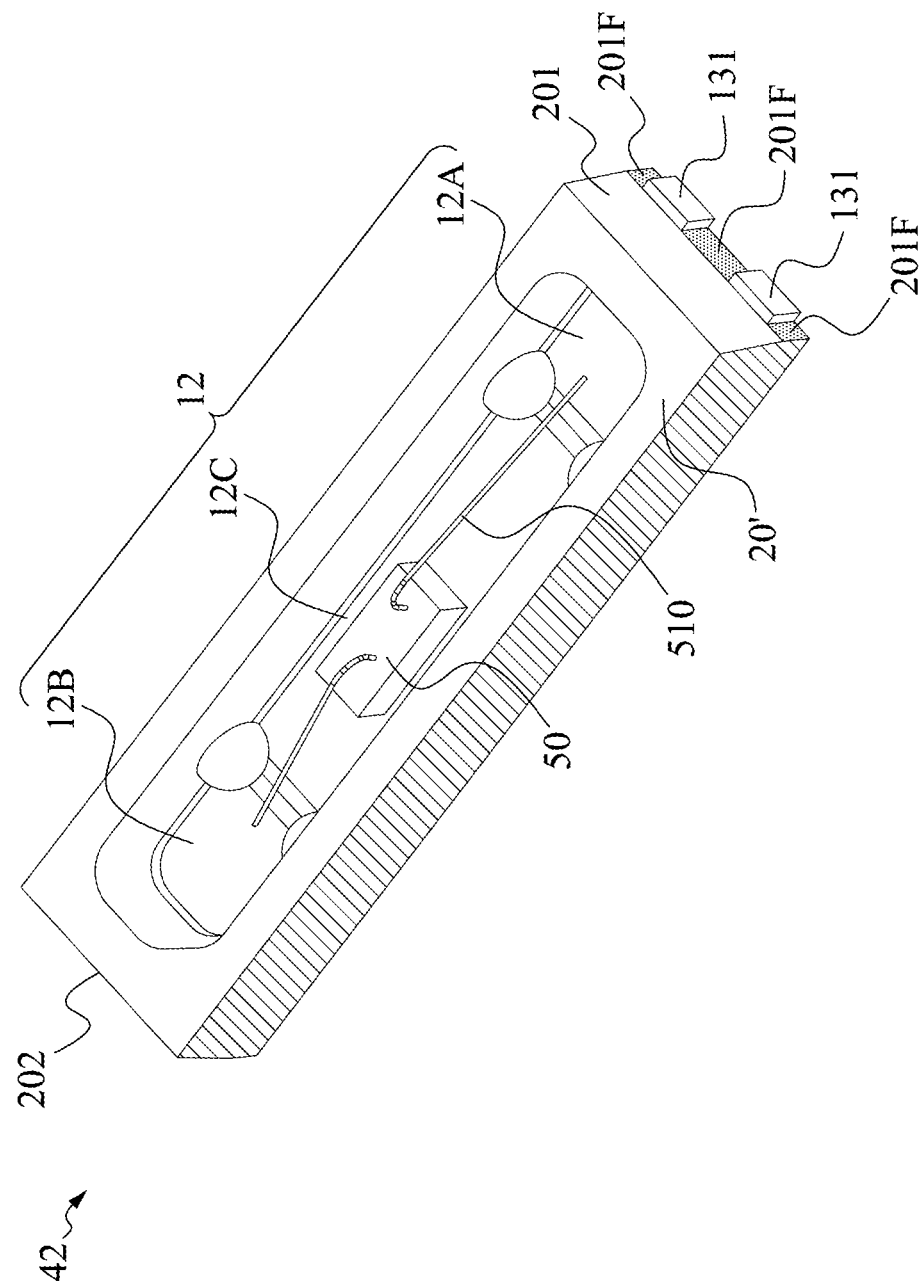

FIG. 9 is a perspective view of an LED package in accordance with some embodiments of the present disclosure. An LED package 42 includes a conductive plate 12, in which the conductive plate 12 has a first metal plate 12A, a second metal plate 12B, and a third metal plate 12C between the first metal plate 12A and the second metal plate 12B. In this embodiment, a light emitting diode 50 is disposed on the third metal plate 12C, and the wires 510 of the light emitting diode 50 are electrically connected to the first metal plate 12A and the second metal plate 12B, respectively.

Further, each of the first metal plate 12A and the second metal plate 12B has two protrusion portions 131 protrude from side surfaces 201 and 202 of a mold 26 of the LED package, respectively. The shape of the protrusion portions 131 may be tuned by designing the punch tool of the punching process as described in FIG. 3. In some embodiments, the side surface 201 has fracture portions 201F, in which one of the fracture portions 201F is present between the two protrusion portions 131.

Figure 10:
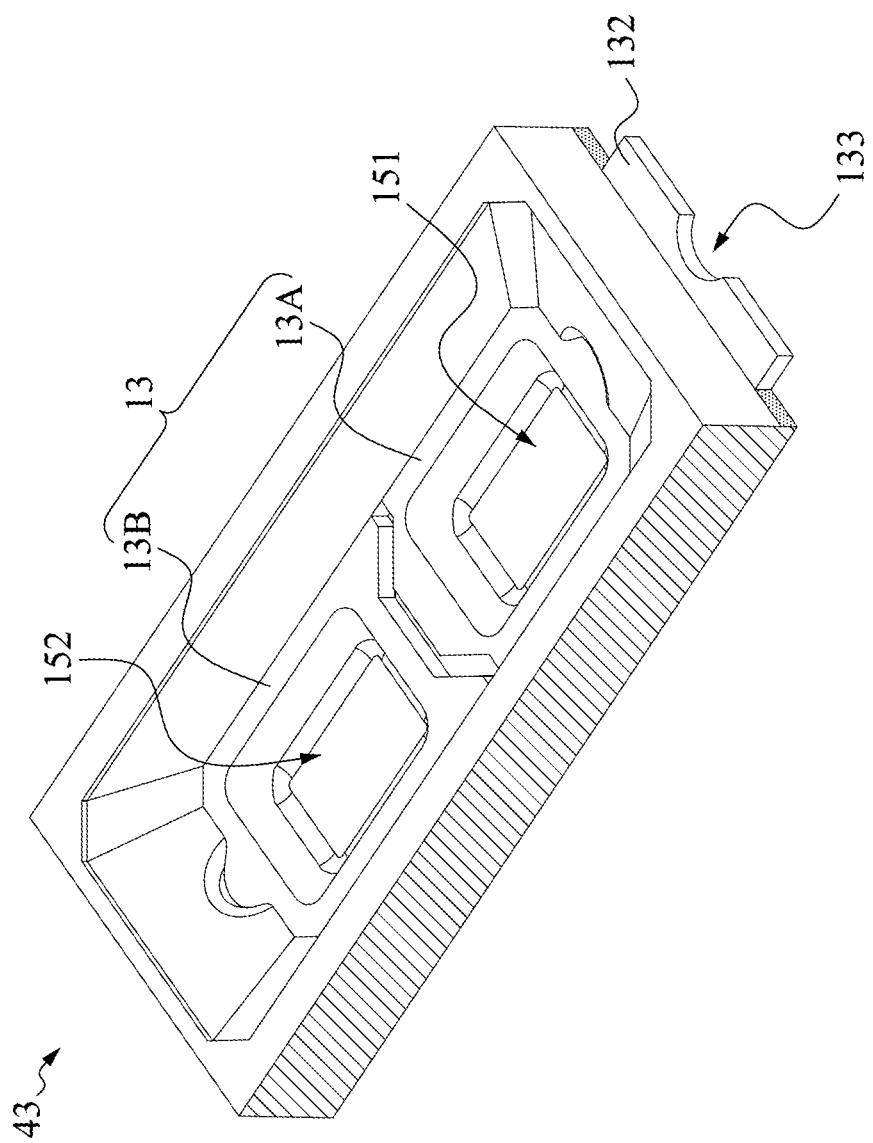

FIG. 10 is a perspective view of an LED package in accordance with some embodiments of the present disclosure. An LED package 43 includes a conductive plate 13, in which the conductive plate 13 has a first metal plate 13B and a second metal plate 13B. In this embodiment, the first metal plate 13A has a recess 151, and the second metal plate 13B has a recess 152, respectively.

Further, the each of the first metal plate 13A and the second metal plate 13B has a protrusion portion 132, in which the protrusion portion 132 has a notch 133. The notch 133 of the protrusion portions 132 may be formed by designing the punch tool of the punching process as described in FIG. 3.

FIGS. 11 to 14 are perspective views of a method for manufacturing an LED package at various stages in accordance with some embodiments of the present disclosure.

Figure 11:
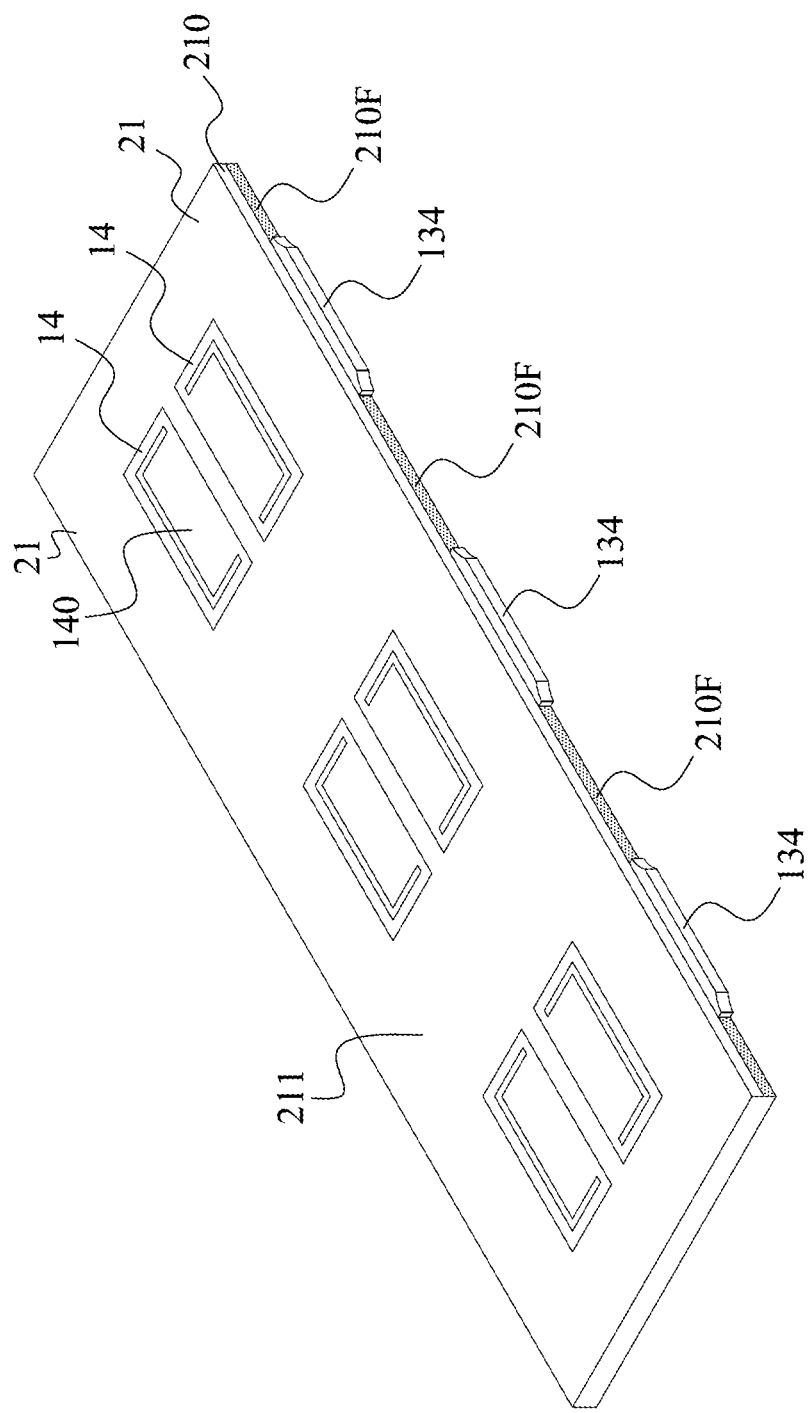
FIGS. 11-14 illustrate a method of manufacturing an LED package at various stages in accordance with some embodiments.

Reference is made to FIG. 11. A base mold 21 is molded over a lead frame 14, in which the lead frame 14 has a plurality of protrusion portion 134 protrudes from a side surface 210 of the base mold 21. The protrusion portion 134 may be formed by a punching process described in FIG. 3, and similar details are not repeated herein. Portions of the lead frame 14 are exposed from the top surface 211 of the base mold 21. In some embodiments, the exposed portions 140 of the lead frame 14 and the top surface 211 of the base mold 21 are substantially coplanar. It is noted that the lead frame 14 may include several holes crossing the base mold 21, which are similar to the first holes 110 described in FIGS. 2A to 2C. Thus, the cutting process in later step may be performed without cutting the lead frame 14.

Figure 12:
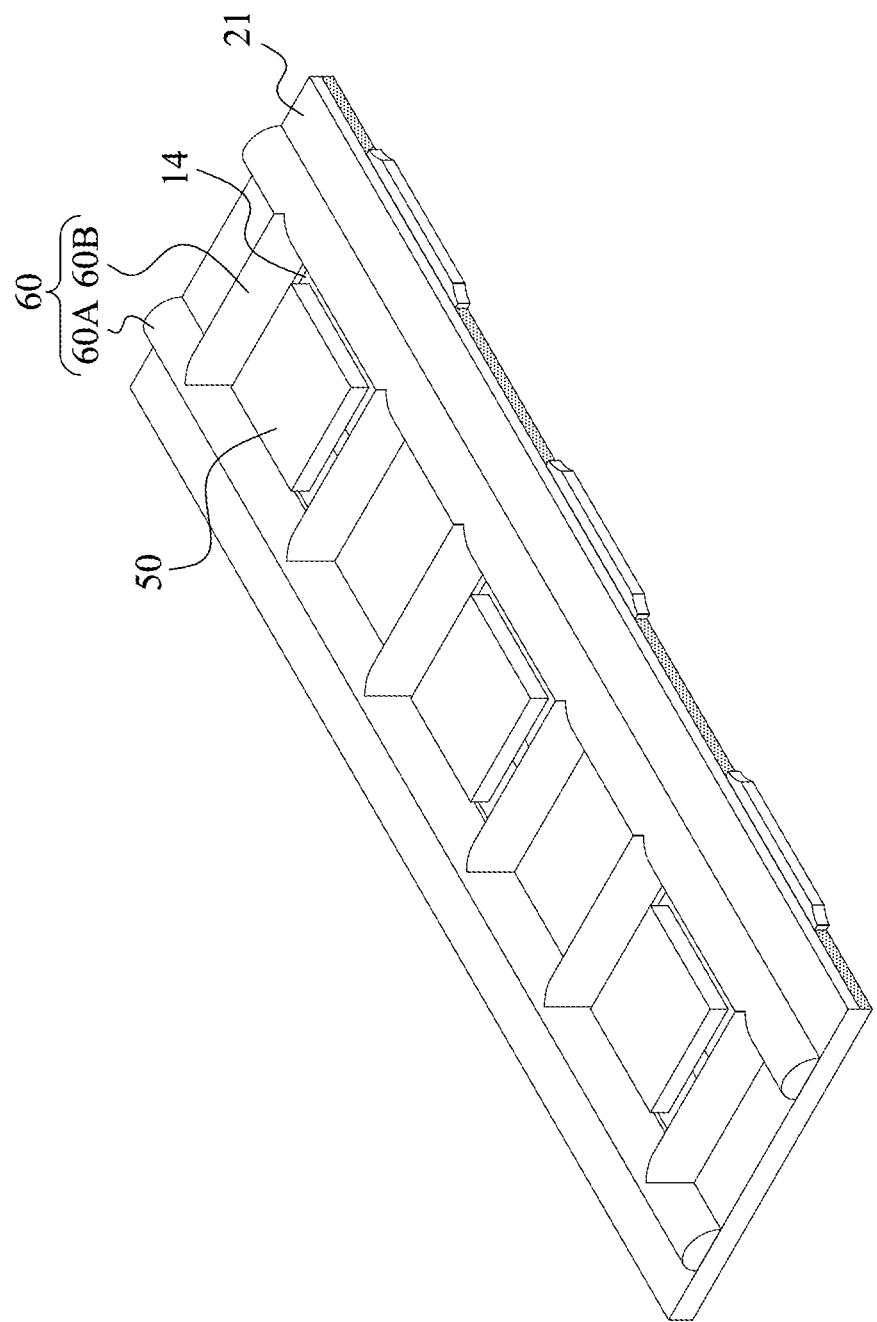

Reference is made to FIG. 12. A plurality of light emitting diodes 50 are mounted on the base mold 21, and the light emitting diodes 50 are electrically connected to the lead frame 14. Then, a dam 60 is formed over the base mold 21 and encloses the light emitting diodes 50. In some embodiments, the dam 60 includes a plurality of first portions 60A and second portions 60B substantially vertical to the first portions 60A, in which the first portions 60A intersect with the second portions 60B to enclose the light emitting diodes 50.

In some embodiments, the dam 60 may be made of resin, such as thermoset epoxy resin, thermoset silicone resin, or combinations thereof. In order to improve the solidifying speed of the thermoset resin, the thermoset resin for forming the dam 60 can include a solidified agent. The dam 60 can further include reflective particles therein, such as titanium oxide particles. Thus, the dam 60 can reflect the light emitted from the LED 50. In some embodiments, the dam 60 can also be formed on the base mold 21 before the light emitting diodes 50 being mounted on the base mold 21.

Figure 13:
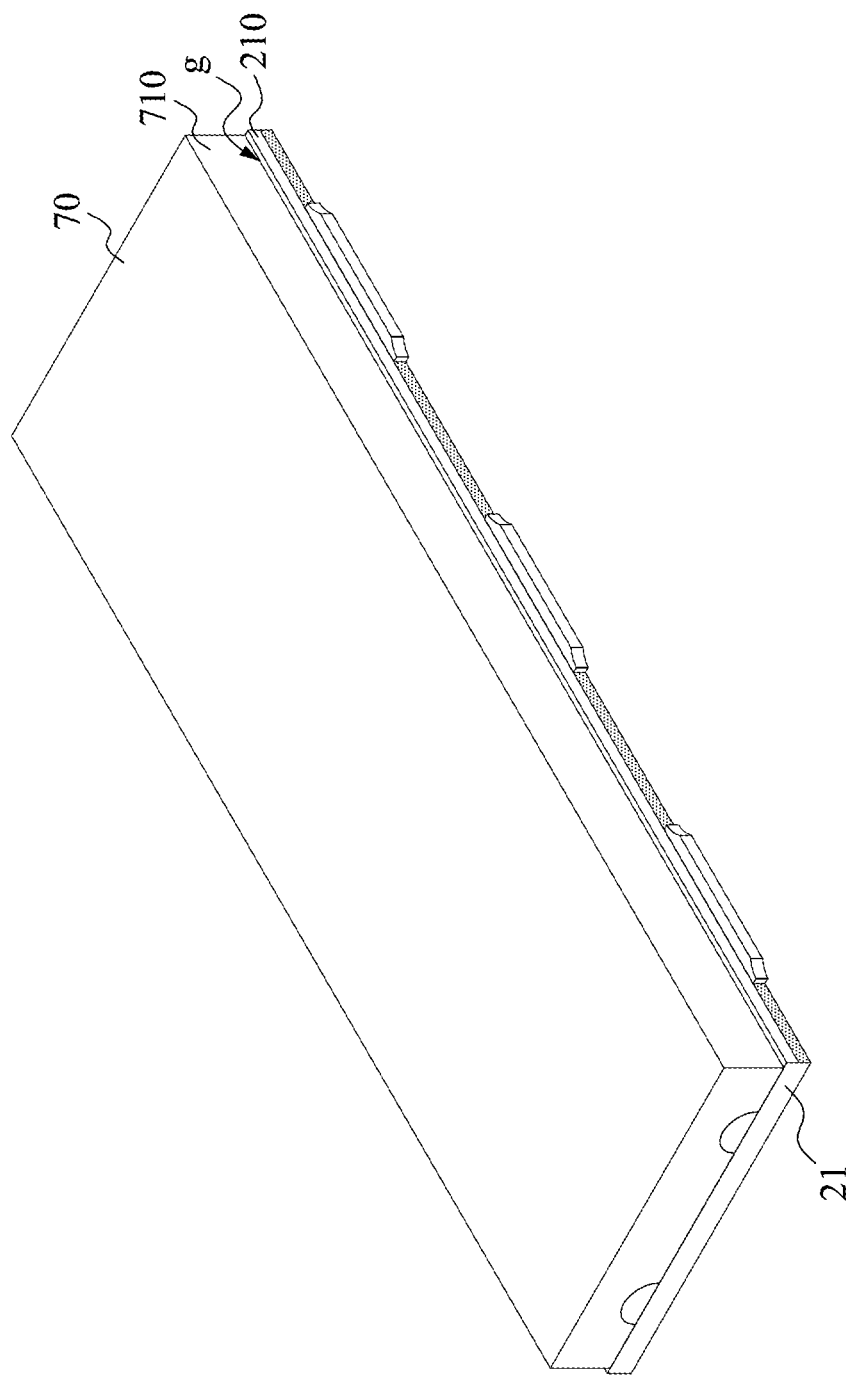

Reference is made to FIG. 13. A cover mold 70 is formed over the base mold 21 to cover the light emitting diodes 50

(referring to FIG. 12) for protecting the light emitting diodes 50 from dust, water, etc. Since the base mold 21 is punched before forming the cover mold 70, the cover mold 70 may be formed to have a width that is slightly smaller than the width of the base mold 21. In other words, the side surface 210 of the base mold 21 and the side surface 710 of the cover mold 70 have a gap g therebetween.

In some embodiments, the cover mold 70 includes fluorescent powder, such as YAG, TAG, silicate, nitride, nitrogen oxides, phosphide or sulfide. The fluorescent powder is used for changing wavelength of light from the light emitting diodes 50.

Figure 14:
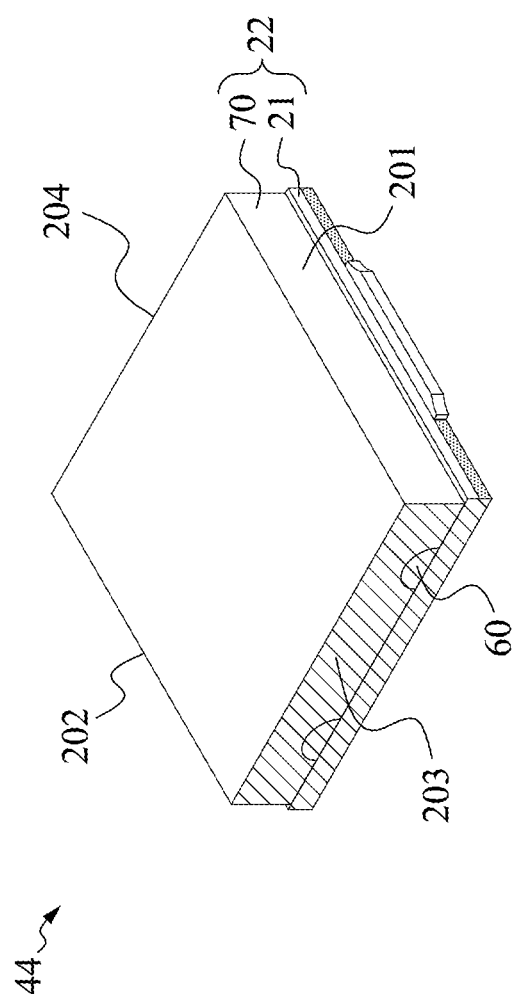

Reference is made to FIG. 14. A cutting process is performed to the base mold 21, the cover mold 70, and the dam 60 to form several LED packages with a cutting tool such as a blade (not shown). Some details similar to FIGS. 5A and 5B are not repeated herein. During the cutting process, the cutting line is predetermined to bypass the lead frame 14 (referring to FIG. 11). It is noted that the cutting process is performed without cutting the lead frame 14.

The LED package 44 includes a mold 22, in which the mold 22 includes a base mold 21 and a cover mold 70. The base mold 21 and the cover mold 70 may be referred to as a bottom portion 21 and a top portion 70 of the mold 22.

In some embodiments, the bottom portion 21 is wider than the top portion 70. Thus, the mold 22 has two opposite side surfaces 201 and 202 having step shape. Further, the mold 22 has two opposite side surfaces 203 and 204, in which the dam 60 is exposed from the side surfaces 203 and 204 of the mold 22. From other perspectives, the side surfaces 203 and 204 are collectively formed by the mold 22 and the exposed dam 60.

Figure 15B:
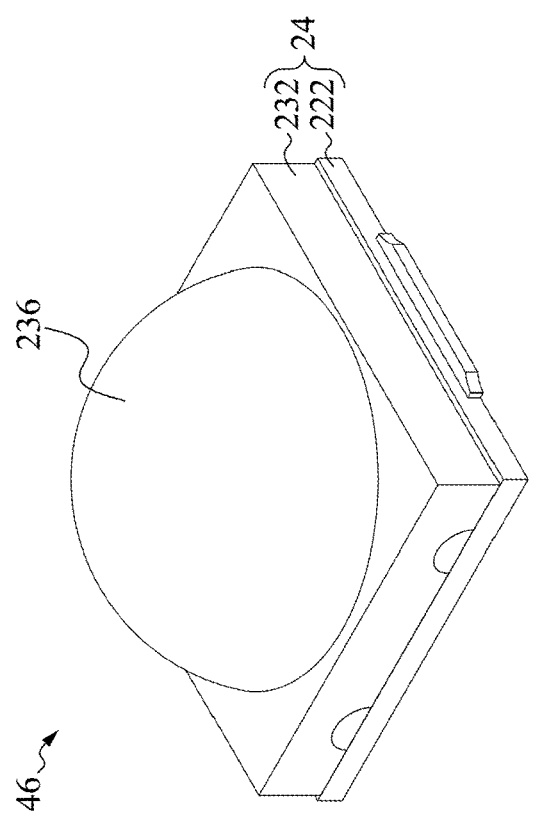
FIGS. 15A and 15B illustrate LED packages in accordance with some embodiments.
Figure 15A:
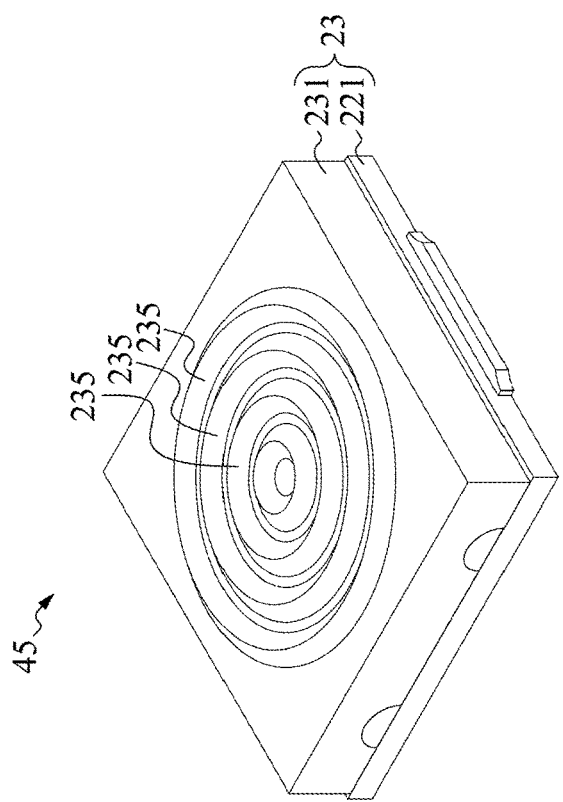

FIGS. 15A and 15B are perspective views of LED packages in accordance with some embodiments of the present disclosure. In an LED package 45 of FIG. 15A, the mold 23 includes a bottom portion 221 and a top portion 231, in which the top portion 231 includes a lens 235 having pluralities of concentric circular prisms. In an LED package 46 of FIG. 15B, the mold 24 includes a bottom portion 222 and a top portion 232, in which the top portion 232 includes a lens 236 having a dome shape.

Figure 16B:
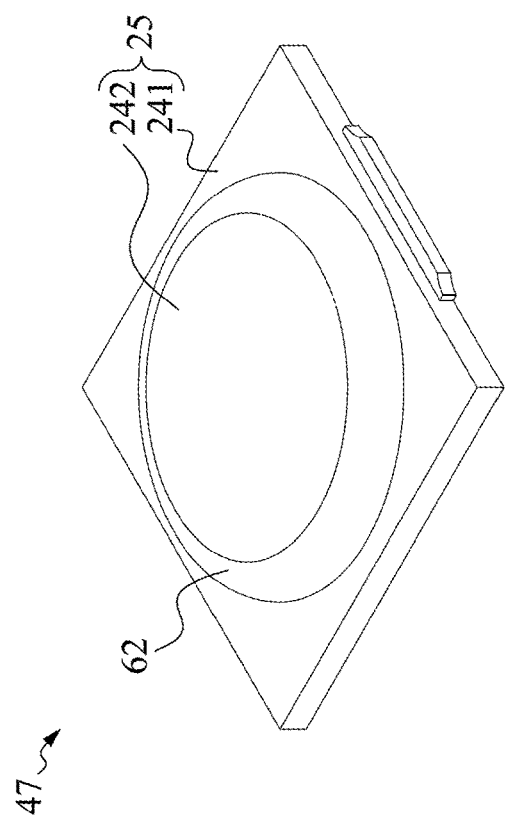
FIGS. 16A and 16B illustrate LED packages in accordance with some embodiments of the present disclosure.
Figure 16A:
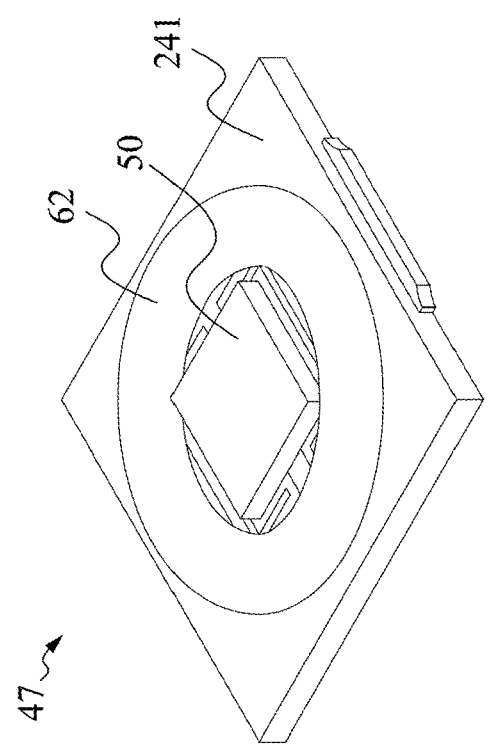

FIGS. 16A and 16B are perspective views of LED packages in accordance with some embodiments of the present disclosure. In an LED package 47 of FIG. 16A, a dam 62 having a ring shape is disposed over a base mold 241 for enclosing the light emitting diode 50. In FIG. 16B, a cover mold 242 having a dome shape is formed over the dam 62 to cover the light emitting diodes 50. The base mold 241 and the cover mold 242 may be collectively referred to as a mold 25, and the base mold 241 and the cover mold 242 may also be referred to as a bottom portion 241 and a top portion 242 of the mold 25. In this embodiment, the dam 62 is exposed from the mold 25.

Figure 17:
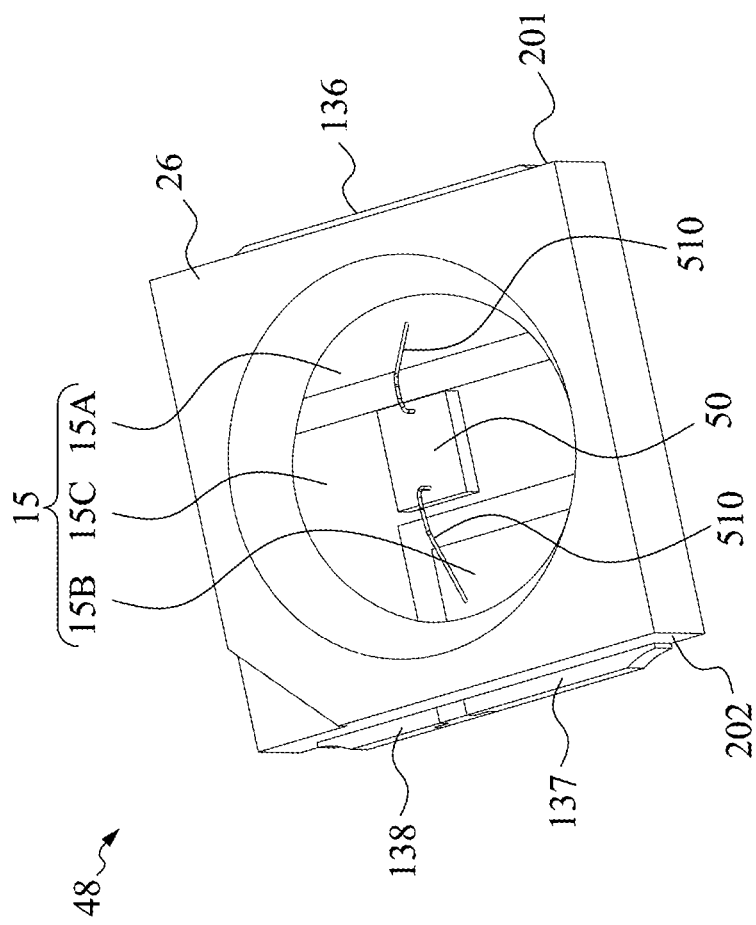
FIG. 17 illustrates an LED package in accordance with some embodiments.

FIG. 17 is a perspective view of an LED package in accordance with some embodiments of the present disclosure. The LED package 48 includes a conductive plate 15 and a mold 26 disposed over the conductive plate 15, in which the conductive plate 15 has a first metal plate 15A, a second metal plate 15B, and a third metal plate 15C. The first metal plate 15A has a protrusion portion 136 protrudes from a side surface 201 of the mold 26, the second metal plate 15B has a protrusion portion 137 protrudes from a side surface 202 opposite to the side surface 201 of the mold 26, and the third metal plate 15C has a protrusion portion 138 protrudes from a side surface 202, respectively. In this embodiment, the protrusion portions 137 and 138 of the metal plates 15B and 15C collectively have a shape that is substantially the same as the protrusion portion 136 of the first metal plate 15A. A light emitting diode 50 is disposed on the third metal plate 15C, and two wires 510 of the light emitting diode 50 are respectively connected to the first metal plate 15A and the second metal plate 15B.

Figure 18:
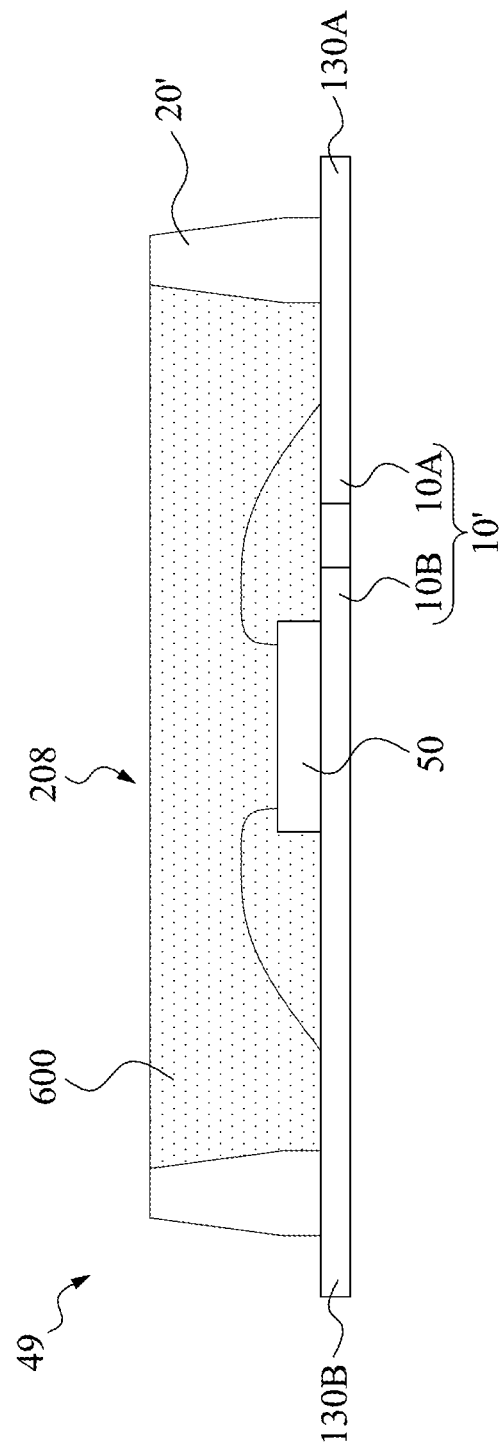
FIG. 18 illustrates an LED package in accordance with some embodiments.

FIG. 18 is a cross-sectional view of an LED package in accordance with some embodiments of the present disclosure. The LED package 49 is similar to the LED package 40 shown in FIGS. 7A and 7B, and similar features are not repeated herein. The LED package 49 may include an encapsulation material 600 filling the opening 208 of the mold 20' to cover the light emitting diode 50. In some embodiments, the encapsulation material 600 may be made from transparent, light penetrable material, such as epoxy resin, silicone, or polymethylmethacrylate.

In some embodiments, the LED package 49 may further include a plurality of phosphors distributed in the encapsulation material 600. The conventional method of producing white-light LED is to add yellow phosphors in the LED package 49.

In some embodiments, the green phosphor has an emission wavelength ranged from 515 nm to 550 nm, and the red phosphor has an emission wavelength ranged from 610 nm to 650 nm with a spectral bandwidth less than or equal to 10 nm. The red phosphors and green phosphors absorb a part of the light emitted from the blue LED, and respectively emit red light and green light. It is noted that the red phosphor has a narrow spectral bandwidth of emission spectral, as compared with the green phosphor, so the color saturation of the red light is higher than that of the green light. The red phosphor has substantially no excitation spectrum in the emission wavelength region of the green phosphor. For example, the green phosphor may be a $Eu_2^+$-activated alkaline earth silicon nitride phosphor, and the red phosphor may be a $Mn_4^+$-activated fluoride complex phosphor.

In other embodiments of the present disclosure, the LED package 49 may further include a first red phosphor and a second red phosphor. The light emitting diode 50 emits primary light, and then the first red phosphor and the second red phosphor absorb a part of the primary light, and emit secondary light having a wavelength longer than that of the primary light. The first red phosphor is a phosphor which emits red light by forbidden transition, and the second red phosphor is a phosphor which emits red light by allowed transition. For example, the first red phosphor is excited by the blue light which is a primary light and emit red (the peak wavelength is equal to or longer than 600 nm and is equal to or shorter than 780 nm) secondary light having a wavelength longer than that of the primary light and the first red phosphor may be a phosphor having a $Mn_4^+$-activated $K_2SiF_6$ structure. The second phosphor is excited by blue light which is a primary light and emits red (peak wavelength is equal to or longer than 600 nm and is equal to or shorter than 780 nm) secondary light having a wavelength longer than that of the primary light. The second red phosphor is a phosphor having a divalent Eu-activated $CaAlAiN_3$ structure. The second red phosphor has a wavelength width of peak wavelength greater than that of the first red phosphor. It is noted that the composition of the divalent Eu-activated alkaline earth silicon nitride phosphor in the encapsulation material may range from about 0.5 wt % to about 14.0 wt %. Therefore, in the package structure having the aforementioned configuration, the primary light (blue light) which is emitted from the blue LED passes through the phosphors. A part thereof excites the first red phosphor thereby being converted into secondary light (red light) and excites the second red phosphor thereby being converted into secondary light (red light). In this way, white light, which is obtained by mixing the primary blue light and the secondary red and green light, is emitted outside of the package structure.

In other embodiments of the present disclosure, the LED package 49 may further include KSF phosphors and quantum dots (QDs). The KSF phosphors are phosphors having a $Mn^{4+}$-activated $K_2SiF_6$ structure. A KSF phosphor refers to a compound including a structure of $A_2(MF_6):Mn_4^+$, in which A may be Li, Na, K, Rb, or NH4, and M may be Ge, Si, Sn, Ti, Zr, or the combination thereof. The KSF phosphors emit red light which has a wavelength width of peak wavelength that is narrowed to approximately 30 nm or less and has high purity. The QD is a kind of nanocrystal phosphor. QDs are mostly inorganic compounds whose properties are stable and may form colloids in water. The feature of the QDs is that the bandgap energy may change with the increase of grain. To be specific, the larger the grain, the smaller the bandgap energy, whereas the larger the bandgap energy. In other words, the smaller the QD, the shorter the wavelength of the light (blue shift), the larger the QD, the longer the wavelength of the light (red shift). In one example of the present disclosure, the QDs may emit green light and red light. The green light has at least one emission peak in a wavelength region ranging from about 515 nm to about 555 nm, and the red light has at least one emission peak with a spectral bandwidth less than or equal to 10 nm in a wavelength region ranging from about 610 nm to about 650 nm. In some embodiments, the emission peak intensity of the green phosphor and the red phosphor at 25° C. is greater than that at 100° C.

In other embodiments of the present disclosure, the LED package 49 may further include an inorganic perovskite quantum dot. The all-inorganic perovskite quantum dot has a chemical formula of $CsPb(ClaBr_{1-a-b}I_b)_3$, in which $0 \leq a \leq 1$, and $0 \leq b \leq 1$. In addition, a modification protection on a surface of the inorganic perovskite quantum dot.

According to the aforementioned embodiments, a lead frame having a plurality of first holes and second holes are provided. Base molds are molded over the lead frame, in which parts of the base molds are molded into the first holes crossing the base molds along a first direction. A portion of the lead frame a portion of the lead frame continuously lies in a space between two adjacent base molds, such that the structural strength of the structure may be improved. A punching process is then performed to the lead frame and the base mold. Since the structural strength of the structure is improved, the punched structure may prevent from damage and have better yield. A cutting process is then performed to the base mold to form several LED packages. The cutting process is performed without cutting the lead frame, and the cost of tool wear can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An LED package structure, comprising:
   a first metal plate having at least one first protrusion portion;
   a second metal plate having at least one second protrusion portion; and
   a mold disposed on the first metal plate and the second metal plate, wherein the mold has a first side surface, a second side surface opposite to the first side surface, a third side surface, and a fourth side surface opposite to the third side surface, wherein the first protrusion portion and the second protrusion portion protrude respectively from the first side surface and the second side surface, and the first metal plate and the second metal plate are covered by the third side surface and the fourth side surface, wherein the first side surface intersects with the third side surface at a first edge, and a portion of the first side surface between the first edge and the first protrusion portion is a fracture surface.

2. The LED package structure of claim 1, wherein the first side surface intersects with the fourth side surface at a second edge, and the first protrusion portion is spaced from the first edge and the second edge.

3. The LED package structure of claim 2, wherein another portion of the first side surface between the second edge and the first protrusion portion is a fracture surface.

4. The LED package structure of claim 1, wherein the fracture surface is rougher than the third side surface.

5. The LED package structure of claim 1, wherein the fracture surface is connected to the third side surface.

6. The LED package structure of claim 1, further comprising a light emitting diode disposed in an opening of the mold, wherein the light emitting diode device is electrically connected to the first metal plate and the second metal plate.

7. An LED package structure, comprising:
   a lead frame having a plurality of first holes and a plurality of second holes, wherein one of the second holes intersects with parts of the first holes; and
   at least one base mold disposed on the lead frame, wherein the base mold comprises a first portion exposed from the lead frame and a second portion engaged in the first holes of the lead frame, and each of the first holes crosses the base mold along a first direction.

8. The LED package structure of claim 7, wherein the base mold comprises a plurality of openings exposing portion of the second holes.

9. The LED package structure of claim 7, wherein each of the first holes comprises two wider portions disposed on opposite sides of the first hole, and the wider portions extend outside the first portion of the base mold along the first direction.

10. The LED package structure of claim 7, wherein the base molds are plural, and a portion of the lead frame continuously lies in a space between two adjacent base molds.

* * * * *